United States Patent
Dietz et al.

(10) Patent No.: US 6,903,552 B2
(45) Date of Patent: Jun. 7, 2005

(54) MAGNETIC RESONANCE APPARATUS WITH EDDY CURRENT COMPENSATION

(75) Inventors: Peter Dietz, Nürnberg (DE); Ralph Kimmlingen, Nürnberg (DE)

(73) Assignee: Siemens Aktiengesellschaft, Münich (DE)

(*) Notice: Subject to any disclaimer, the term of this patent is extended or adjusted under 35 U.S.C. 154(b) by 0 days.

(21) Appl. No.: 10/777,554

(22) Filed: Feb. 12, 2004

(65) Prior Publication Data

US 2004/0222795 A1 Nov. 11, 2004

(30) Foreign Application Priority Data

Feb. 12, 2003 (DE) .......................................... 103 05 835
Jan. 28, 2004 (DE) .................................... 102004004293

(51) Int. Cl.⁷ ................................................ G01V 3/00
(52) U.S. Cl. ........................................ 324/318; 324/322
(58) Field of Search ................................ 324/318, 322, 324/319, 309, 307, 300

(56) References Cited

U.S. PATENT DOCUMENTS

| | | | |
|---|---|---|---|
| 4,670,716 A | 6/1987 | Kunz | 324/309 |
| 5,227,728 A * | 7/1993 | Kaufman et al. | 324/322 |
| 5,332,969 A * | 7/1994 | Tsuruno et al. | 324/309 |
| 5,442,290 A * | 8/1995 | Crooks | 324/309 |
| 6,147,494 A * | 11/2000 | Ham | 324/318 |
| 6,335,620 B1 | 1/2002 | Weissenberger | 324/307 |
| 6,492,817 B2 * | 12/2002 | Gebhardt et al. | 324/318 |
| 6,531,870 B2 | 3/2003 | Heid et al. | 324/318 |
| 6,545,473 B1 | 4/2003 | Gebhardt et al. | 324/318 |
| 6,696,836 B2 * | 2/2004 | Kimmlingen | 324/309 |
| 2004/0183535 A1 * | 9/2004 | Heid | 324/318 |

FOREIGN PATENT DOCUMENTS

| | | |
|---|---|---|
| EP | 0 164 199 | 12/1985 |
| EP | 0 304 126 | 2/1989 |
| GB | 2 180 943 | 9/1986 |
| JP | 2 002112977 | 8/2004 |

* cited by examiner

*Primary Examiner*—Brij B. Shrivastav
(74) *Attorney, Agent, or Firm*—Schiff Hardin LLP

(57) ABSTRACT

A magnetic resonance apparatus has a coil arrangement to generate a magnetic gradient field in an imaging volume and an electrically-conductive structure that at least partially surrounds the coil arrangement and in which, given a temporally changing current flow in the coil arrangement, eddy currents are caused that produce an eddy current field interfering with the gradient field within the imaging volume. For eddy current compensation the coil arrangement has at least two conductor sections from the group of: a first conductor section that contributes to the generation of the gradient field, and that additionally generates via the electrically-conductive structure a first interference factor in the form of a first eddy current field in the imaging volume, a second conductor section that contributes both to the generation of the gradient field, thereby generating via the electrically-conductive structure a second interference factor in the form of a second eddy current field in the imaging volume, and that generates a field compensating the first eddy current field, and a third conductor section that contributes exclusively to the compensation of interference factors in the form of an eddy current field. One of the conductor sections contributing to the compensation of interference factors is spaced, relative to the imaging volume, at less than or equal to the distance of one of the conductor sections contributing to the gradient field.

13 Claims, 3 Drawing Sheets

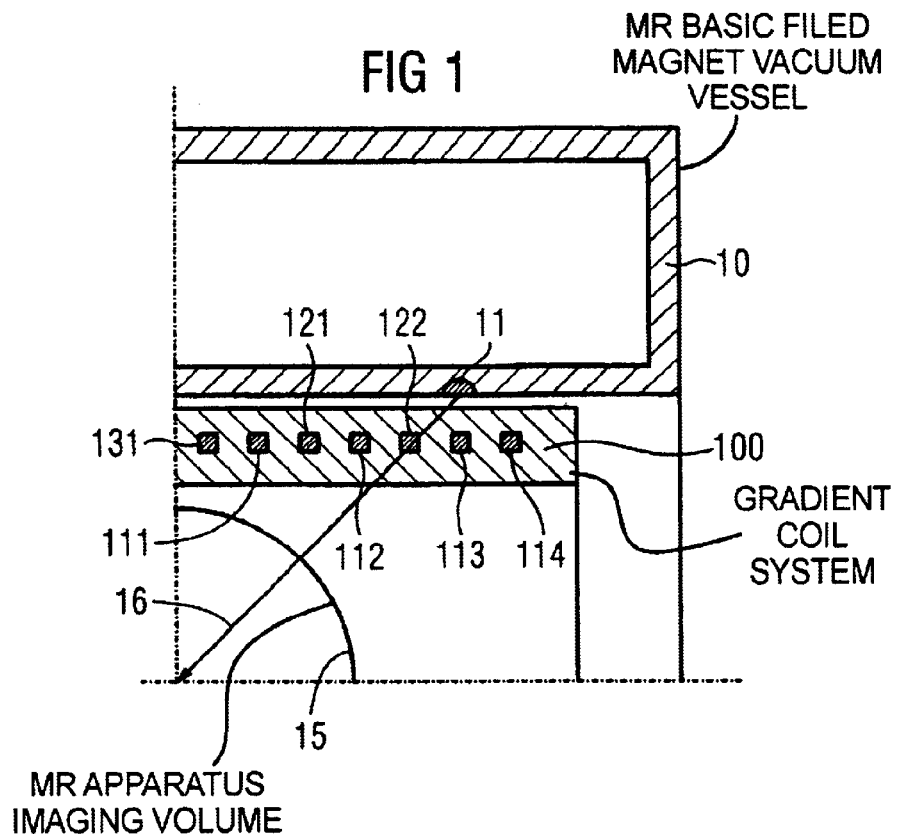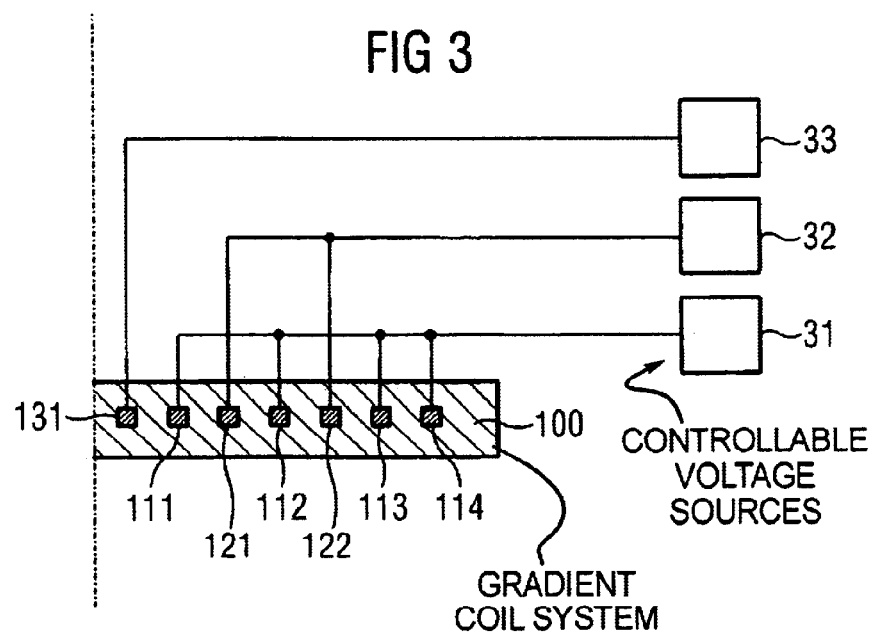

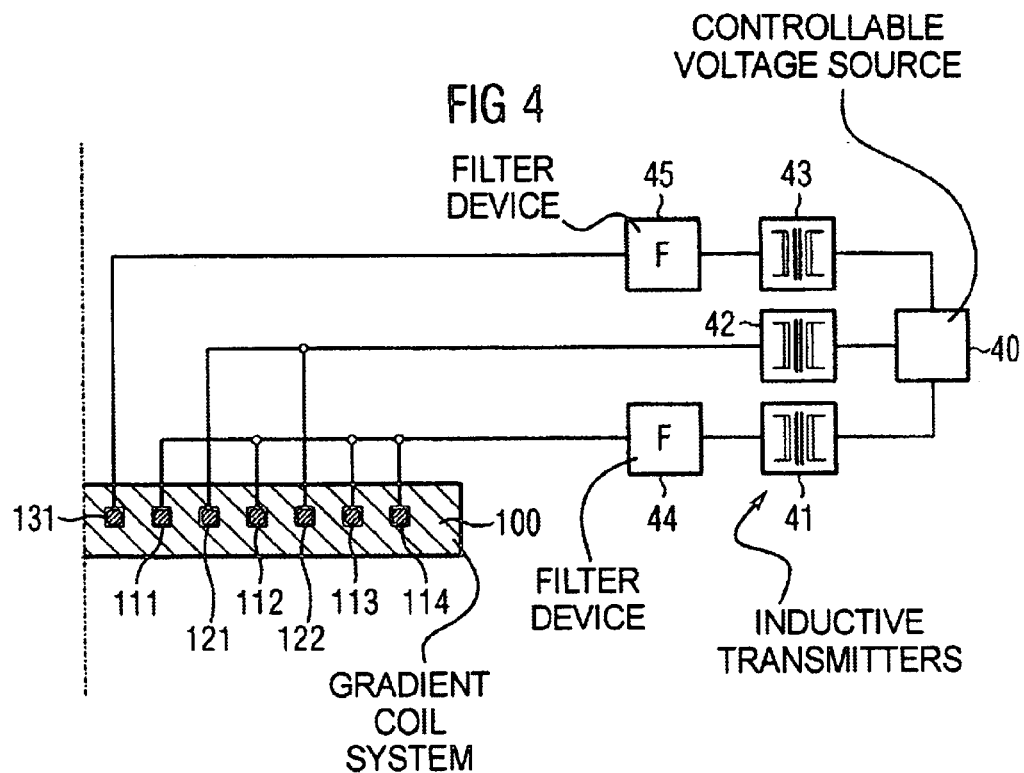
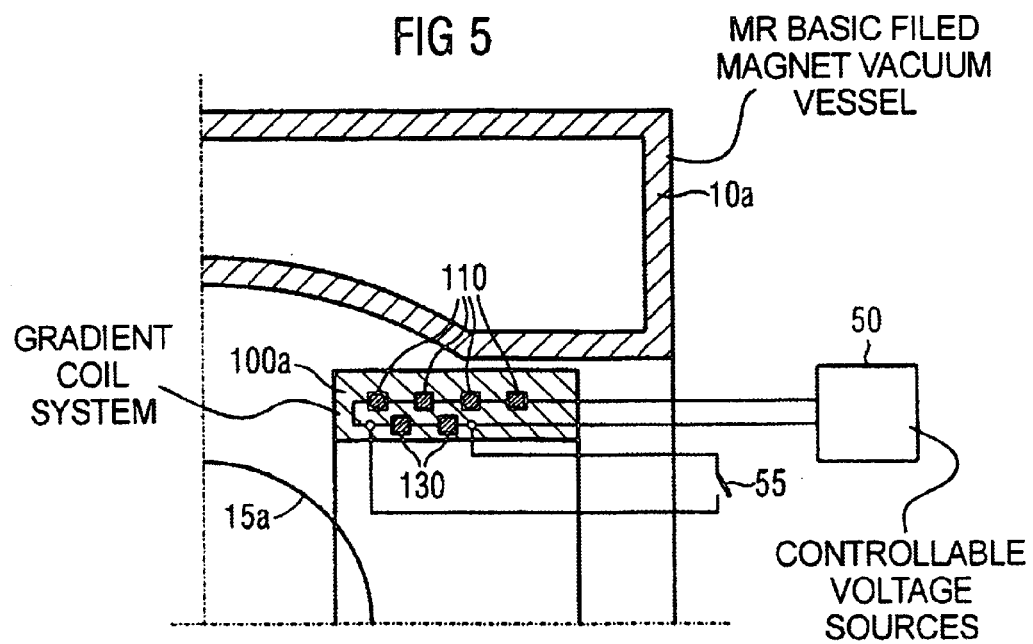

MAGNETIC RESONANCE APPARATUS WITH EDDY CURRENT COMPENSATION

BACKGROUND OF THE INVENTION

1. Field of the Invention

The present invention concerns a magnetic resonance apparatus.

2. Description of the Prior Art

Magnetic resonance technology is a known modality for acquiring images of the inside of a body of an examination subject. In a magnetic resonance apparatus, rapidly switched gradient fields, which are generated by a gradient coil system, are superimposed on a static homogenous basic magnetic field that is generated by a basic field magnet. The magnetic resonance device also has a radio-frequency system that radiates radio-frequency signals into the examination subject to excite magnetic resonance signals, and that acquires the generated magnetic resonance signals, on the basis of which magnetic resonance images are created.

To generate the gradient field, appropriate currents are adjusted (set) in the gradient coil. The amplitudes of the required currents amount to more than 100 A. The current rise and fall rates amount to more than 100 kA/s. For power supply, each gradient coil is connected to a gradient amplifier. Since the gradient coil system normally is surrounded by electrically conductive structures, eddy currents are induced by the switched gradient fields. Examples of such conductive structures are the vacuum vessel and/or the cryoshield of a superconducting magnet used as the basic field magnet. The fields generated as a consequence of the eddy currents are undesirable because, without counteracting measures, they weaken the gradient fields and distort their time curves, which leads to an impairment of the quality of magnetic resonance images.

The impairment of a gradient field as a result of the eddy current fields can be compensated up to a certain degree by a corresponding predistortion of a quantity controlling the gradient field. To compensate, the controlling quantity is thereby filtered such that eddy current fields ensuing given non-predistorted operation of the gradient coil are cancelled by the predistortion. A filter network can be used for filtering having parameters determined by the time constants and coefficients that can be determined, for example, with a method described in German OS 198 59 501.

Furthermore, the eddy currents induced on a predeterminable enveloping surface (that, for example, proceeds through an inner cylinder jacket of an 80-K cryoshield of the superconducting basic field magnet) by the gradient coils being fed current can be reduced by the use of an actively-shielded gradient coil system. For this purpose a secondary coil associated with the gradient coil, normally having a lower number of windings than the gradient coil, is connected with the gradient coil such that the same current that flows through the gradient coil flows through the secondary coil, but in the opposite direction. The secondary coil thereby has a weakening effect on the gradient field in the imaging volume. A gradient coil with an associated secondary coil to reduce a gradient field on a predeterminable enveloping surface is specified in British Application 2 180 943, for example.

A magnetic resonance apparatus is described in German OS 34 11 222 that has three gradient coils to generate gradient fields and at least one further coil arrangement, operable independently of the gradient coils, to generate a magnetic field in the direction of the basic magnetic field. The further coil arrangement is fashioned such that the magnetic field, non-linearly changes spatially, and such that a superimposition of the magnetic field with gradient fields yields a defined, temporal, spatial change of a magnetic flux density. The further coil arrangement is fashioned in an embodiment such that the magnetic field exhibits a spatial curve that corresponds to a spherical function of the second or third order. In particular, unwanted eddy current effects caused by the gradient fields can be corrected with the further coil arrangement.

A method is described in German OS 101 09 543 for operating a magnetic resonance apparatus with a gradient coil system having at least one gradient coil to generate a gradient field in an imaging volume and at least one shield coil, controllable independently of the gradient coil, to generate a shielding field with which the gradient field can be neutralized. In this method, the suitably fashioned shield coil can be operated independently of the gradient coil to compensate eddy current fields of the first and higher order in the sense of a series expansion of a spherical function. The shield coil alternatively can be operated as an active shielding coil and is therefore arranged between the gradient coil and the eddy current field source, and must be disposed, as is the gradient coil, a distance from the imaging volume. In an embodiment, the shield coil is connected in series with parts of the gradient coil which, in the operation mode "eddy current field compensation," do not contribute to the gradient field generation in the imaging volume.

A magnetic resonance apparatus with a gradient coil system is known from German OS 101 56 770 in which an electrically-conductive structure is arranged and fashioned such that a magnetic field (caused by a gradient field due to induction effects) of the structure is similar (in the structure sense) to the gradient field, at least within an imaging volume of the magnetic resonance apparatus. In an embodiment, at least one part of the structure is barrel-shaped, as a component of the basic field magnet. Among other things, this allows the gradient coil system to be designed without secondary coils, since the undesirable consequences of the switched gradient fields due to the similarity of the magnetic field caused by the structure can be almost completely controlled by a predistortion. The complete control is based on the assumption that all eddy currents decay with the same time constant.

A switchable gradient coil based on saddle coils that can be operated as main or supplementary coils is known from German PS 199 17 058, wherein the supplementary coils exhibiting a correspondingly decreased covering angle are arranged for one gradient axis in the openings between coils that are arranged diametrically displaced in a radial plane for the other gradient axis. The supplementary coils lie, for example, either on an inner or outer radial position. The combination of various supplementary coils for various axes in the radial position enables a small-volume assembly of gradient coils. For example, the active shielding of gradient coils, with which eddy currents are prevented outside of the gradient coils, is mentioned in the prior art discussed in that document. The subject of eddy currents is not considered further, thus for example a conductive structure is not discussed in connection with the device disclosed in that document, in particular in connection with the main and intermediate coils. There is no description of how the main and supplementary coils should be connected to achieve the various desired performance characteristics (for example linearity, linearity volumes, shielding, . . . ), or of how the main and supplementary coils functionally interact, except for static and dynamic connections.

SUMMARY OF THE INVENTION

An object of the present invention to provide a magnetic resonance apparatus having with a coil arrangement that generates a gradient field in an imaging volume, wherein efficient compensation of eddy current fields in the imaging volume is accomplished with a simple and compact structure.

This object is inventively achieved by a magnetic resonance device having a coil arrangement that generates a magnetic gradient field in an imaging volume of the magnetic resonance device, and an electrically-conductive structure that at least partially surrounds the coil arrangement, and in which, given a temporally changing current flow in the coil arrangement, eddy currents are caused that produce an eddy current field interfering with the gradient field within the imaging volume, wherein the coil arrangement has at least two of the following conductor sections: a first conductor section contributing to the generation of the gradient field, that additionally generates, via the electrically-conductive structure a first interference factor in the form of a first eddy current field in the imaging volume, a second conductor section that both contributes to the generation of the gradient field, thereby generating by the electrically-conductive structure a second interference factor in the form of a second eddy current field in the imaging volume, and also generates a field compensating the first eddy current field, and a third conductor section contributing exclusively to the compensation of an interference factor in the form of an eddy current field.

Furthermore, one of the conductor sections contributing to the compensation of interference factor is spaced, relative to the imaging volume, at a distance that is less than or equal to the distance relative to the imaging volume of one of the conductor sections contributing to the gradient field.

A complete compensation of the eddy current field formed in a very complex manner with regard to its spatial curve is thereby enabled, with a more compact assembly being achieved by the arrangement of the conductor sections that can be fed current to, among other things, compensate the eddy current field. In direct contrast to a conventional gradient coil (actively shielded with a secondary coil) for the compensation effect of the inventive coil arrangement is achieved with a placement as close as possible to the imaging volume, in particular of conductor sections that can be fed current exclusively to compensate the eddy current field.

The coil arrangement can be used with particular advantage in a magnetic resonance apparatus of the type described in German OS 101 56 771, since the apparatus then operates with a lesser deformation of the electrically-conductive structure, which in particular achieves freedoms for the design of the basic field magnet. Furthermore, differing temporal decays of eddy current fields also can be compensated. However, the advantage of the thin-walled (since it is not actively shielded) gradient coil system in comparison with a gradient coil system that is actively shielded with secondary coils remains, since among other things the conductor sections of the coil arrangement that are fed current to compensate the eddy current field can be arranged in the same plane as the remaining conductor sections also contributing to the gradient field.

An exemplary operating mode of the inventive magnetic resonance device is described in the following with regard to the gradient field generation.

In the magnetic resonance apparatus, eddy currents are caused (by a switched gradient field (for example in electrically-conductive parts of the basic field magnet system) that lead to magnetic eddy current fields that can be described by a linear as well as a nonlinear spatial and temporal dependency in the imaging volume (interfering factors with regard to the desired gradient field). According to the invention, these eddy currents are not prevented by an active shielding acting on the electrically-conductive structure as a "magnetic counter-field", but instead the magnetic eddy current fields in the imaging volume are compensated by conductor sections fashioned for this purpose. Compensating conductor sections can be fashioned such that they simultaneously also contribute to the gradient field generation, but this may cause further possible eddy current fields, which must be compensated, to be generated in the imaging volume by the electrically-conductive structure. The list of the types of conductor sections that are suitable results from this consideration.

The eddy current field compensation ensues with an arrangement of at least two conductor sections from the aforementioned list, with at least one of the conductor sections being fashioned such that it contributes to the gradient field, and thus generates a first eddy current field via the electrically-conductive structure, and another of the sections being fashioned such that it compensates this first eddy current field. Advantageously, the compensating conductor section lies closer to the imaging volume than the first conductor section that generates the first eddy current field, since this makes the compensation easier. In an embodiment, the compensating conductor section is arranged between the conductor section and the imaging volume, such that its compensation field exhibits a field curve similar to the eddy current field.

In an embodiment, the compensating conductor section also contributes to the gradient field. In general, it then effects, via the electrically-conductive structure, a second eddy current field which is different from the first eddy current field that is compensated by this conductor section. A last, as of yet uncompensated eddy current field is compensated by a conductor section that does not contribute to the gradient field, and thus generates no eddy current field. It should be noted that, due to the difference in magnitude between a gradient field and a field that compensates an eddy current field, the latter substantially effects its own negligible eddy current field via the electrically-conductive structure. This own eddy current field falls to smaller levels the closer it is to the compensating conductor section at the imaging volume, and the farther removed it thus is from the electrically-conductive structure.

As is typical in gradient fields, a spatial curve of such an eddy current field generated by a magnetic flux density of the gradient field and to be compensated can be described by a spherical function expansion. The eddy current field is thereby directly dependent on the gradient field, since it is caused by a temporal change of the magnetic flux density if the gradient field. Eddy current fields with greater geometric similarity to the gradient field can be compensated with a predistortion. The eddy current field, however, is dependent on the geometry of the electrically-conductive structure. Nonlinear contributions based thereon in the eddy current field can likewise be compensated with the invention.

In general, a time response of the eddy current field can be described by exponential functions in connection with the time constants characterizing the exponential functions, both during a time segment of the temporal change of the gradient flow and during a directly subsequent time segment during which no temporal change of the gradient field ensues and the previously excited eddy current fields only decay. Time constants for different arrangements of the eddy current field, described, for example, by various spherical functions, can be different. Such complex eddy current fields also can be compensated by, for example, the compensation of a number of conductor sections with functions according to the above list.

A simplification in the inventive compensation of the eddy current fields in accordance with the invention can be effected by an appropriate design of the electrically-conductive structure. For example, a barrel-shaped bulge has an advantageous effect on the compensating arrangement such that, with regard to the high nonlinearity, the gradient field also can be compensated simply with the invention.

Further freedom in the compensation of the eddy current fields results from the separate control of the conductor sections. Namely, a series circuit of at least two conductor sections enables the use in the ideal case of only one power supply that, however, places higher requirements on the design of the conductor sections. This can, however, be balanced, for example by the geometry of the electrically-conductive structure. In contrast, however, a separate control is more complicated with regard to the power supply but offers under the circumstances an additional degree of freedom in the compensation, for example for compensation of higher orders of the spherical function expansion of the eddy current field. The separate power supply can be simplified in an embodiment employing a single voltage source.

DESCRIPTION OF THE DRAWINGS

FIG. 1 is a longitudinal section through a portion of a magnetic resonance device with a gradient coil divided into three conductor sections, in accordance with the invention.

FIG. 3 shows a connection of the three sections of the gradient coil to three voltage sources that can be controlled independently of one another.

FIG. 4 shows a connection of the three sections of the gradient coil to a single controllable voltage source via inductive transmitters (repeaters) and filter devices.

FIG. 5 is a longitudinal section through a portion of a magnetic resonance device with a conductor section, together with associated correction coil as well as a hollow-cylindrical basic field magnet exhibiting a barrel-shaped, bulged hollow bore.

DESCRIPTION OF PREFERRED EMBODIMENTS

Figure 2A:
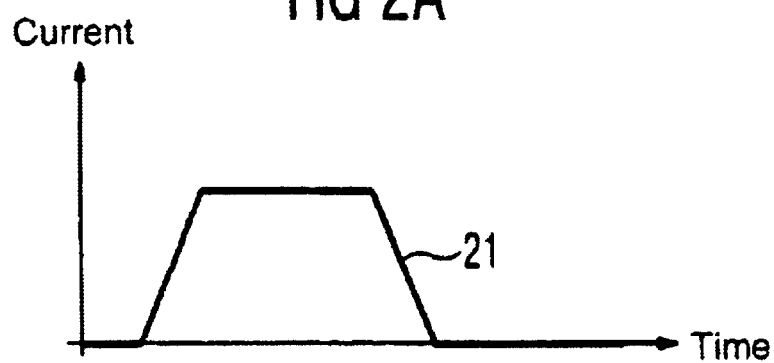
FIGS. 2A, 2B and 2C are time curves of currents in the individual sections of the gradient coil, respectively.

As an exemplary embodiment and as explanation of the invention, FIG. 1 shows a longitudinal section through a magnetic resonance apparatus (only the right upper quadrant of the apparatus in longitudinal section is shown). To generate an optimally homogenous static basic magnetic field in the imaging volume 15, the magnetic resonance apparatus has a superconducting basic field magnet, the vacuum vessel 10 (made of stainless steel) of which is shown in FIG. 1. To generate gradient fields, a likewise substantially hollow-cylindrical gradient coil system 100 is disposed in a bore of the hollow-cylindrical basic field magnet. To generate a gradient field with a gradient in the direction of the hollow cylinder main axis, the gradient coil system 100 has a longitudinal gradient coil that has annular conductor sections 111 through 131 that can be controlled at least partially independently of one another. For clarity, known, further components of the magnetic resonance device (for example a radio-frequency antenna) are not shown.

For explaining the invention, it is initially assumed that, in the conductor section 113, a temporally varying electrical current flows that, with regard to the central point of the imaging volume 15, generates a desired field contribution to the longitudinal gradient field. This temporally varying current induces, in the region of the electrically-conductive vacuum vessel 10, an eddy current with an associated magnetic field that is an interfering factor (characterized by arrow 16) with regard to the central point of the imaging volume 15. Using the curve of the arrow 16 that proceeds through the cross-section of the conductor section 122, it can be seen that the interfering factor that is caused by eddy current effects of the current in the conductor section 113 can be substantially shielded from the imaging volume 15, by feeding an electrical current into the conductor section 122 that compensates the eddy current field in the direction of the imaging volume 15. Furthermore, an electrical current is also supplied, as is usual, into conductor section 122 that contributes to the longitudinal gradient field. This gradient field-generating current, in the same manner as explained for the conductor section 113, causes an eddy current in the vacuum vessel 10 that, as explained for the conductor section 113, acts in the imaging volume 15. For the compensation of this further eddy current, a compensation-effecting current can be fed into the conductor section 112. This description is also true for the further conductor sections 112, 121 and 111.

The inner conductor section 131 and the outer conductor section 114 will be separately considered. Since the outer conductor section 114 has no eddy current field of a further conductor section to compensate, a compensation current in the conductor section 114 is superfluous, so that the conductor section 114 supplies only the gradient field-generating current. Since, relative to the inner conductor section 131, no additional, further-inward conductor section exists, and thus also no need for compensation of an eddy current field, the inner conductor section 131 is operated exclusively to compensate an eddy current field caused by other conductor sections.

The aforementioned compensation assumes a similarity of the directly generated gradient field to the eddy current field. In the representation of the spatial curve of the gradient field and the eddy current field in the form of a series expansion of a spherical function, the difference between the spherical coefficients of both fields is dependent on the distance of the gradient coil to the vacuum vessel 10, as an eddy current surface, and its shape. The larger the distance, the larger the efficiency of the gradient coil, however at the same time the difference in the spherical coefficients becomes larger. Regarding FIG. 1, given identical shapes of the gradient coil and vacuum vessel 10, the eddy current field can be interpreted as a field (simplified with regard to its curve) as if it had been generated by the gradient coil itself with its conductor sections are displaced toward the imaging volume 15.

Figure 2B:
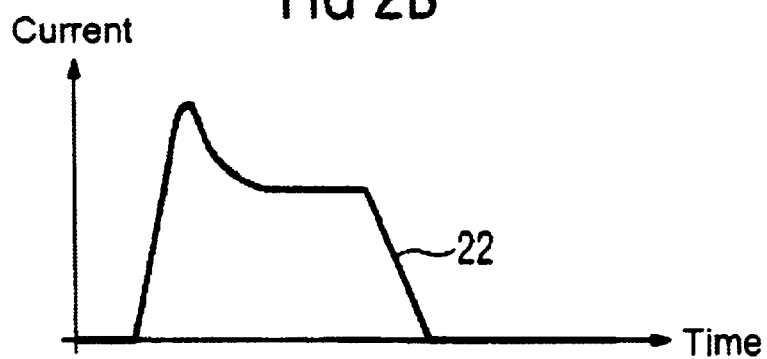
Figure 2C:
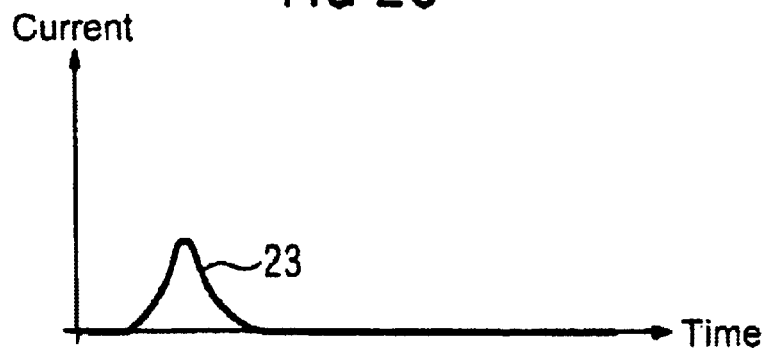

Depending on the occurrence of the previously specified dependencies, it is possible that not all of the conductor sections 111, 121, 112, 122 and 113 need to be operated with the compensation-effecting current. For example, in FIG. 1 only the conductor sections 121 and 122 are provided with the compensation-effecting and gradient field-generating current for simultaneous operation. The gradient coil is thus divided into three sections. A first section includes the conductor sections 111, 112, 113, 114, that are operated only with the gradient field-generating current. A second section includes the conductor sections 121 and 122 which are operated with the gradient field-generating and the compensation-effecting current, and a third section includes the conductor section 131 that is operated only with the compensation-effecting current. As an example for a trapezoidal gradient pulse, FIG. 2A shows the time curve 21 of the gradient field-generating current for the first section, FIG. 2B shows the time curve 22 of the simultaneous gradient field-generating and compensation-effecting current for the second section, and FIG. 2C shows the time curve 23 of the exclusively compensation-effecting current for the third section.

FIG. 3 shows a circuit of the three sections of the gradient coil with three voltage sources 31, 32, 33 (also designated as gradient amplifier) that can be controlled independently of one another to adjust (set) the different current-time curves 21, 22 and 23 in the three sections. The controllable voltage source 33 for the third section can be dimensioned relatively smaller in comparison to the other voltage sources 31 and 32, since only the single conductor section 131 must be supplied with the compensation-effecting current. The voltage source 32 and 33 that can be controlled independently of one another can be used to respectively charge the second and third sections with a compensation-effecting current of another time constant, such that eddy current fields with different time constants can be compensated.

As an alternative to FIG. 3, FIG. 4 shows the connection to a single controllable voltage source 40, with appropriately designed filter devices 44 and 45 being connected between the first and the third sections of the gradient coil on one side, and the controllable voltage source 40 on the other side, to adjust the solely gradient field-generating current in the first section and the solely compensation-effecting current. Furthermore, respective inductive transmitters 41, 42 and 43 are connected between the filter devices 44 and 45 and between the second section of the gradient coil on one side and the voltage source 40 on the other side. The filter devices 44 ad 45 can be, for example, hardware parameterizable high-pass filters, such that the aforementioned currents of different time constants can be correspondingly generated for the individual sections. In other embodiments, the voltage division from the single controllable voltage source 40 to the three sections can be accomplished by suitably fashioned voltage dividers.

The above description for a longitudinal gradient coil of a hollow-cylindrical gradient coil system 100 is also valid for a transversal gradient coil system (for example, having four sub-coils) of the gradient coil system 100, with for example, the outermost winding of one of the sub-coils corresponding to the conductor section 131. The above description also is valid for gradient coil systems of other forms (shapes), for example for disc-shaped gradient coils.

In an embodiment, by leaving out the third section, for example, the controllable voltage source 33 can be foregone in the case of FIG. 3, and the filter device 45 and the inductive transmitter 43 can be foregone in the case of FIG. 4, so the expenditure in the power supply of the sections is reduced, but at the same time certain limitations naturally have to be accepted in the compensation possibilities, for example with regard to linearity of the gradient fields within the imaging volume. With regard to a conventional actively or even inactively shielded gradient coil, however, an increased expenditure in the power supply still remains.

A further embodiment of the invention is shown in FIG. 5 in which, as in a conventional gradient coil system, one gets by with one controllable voltage source per gradient coil is used. FIG. 5 shows a longitudinal section through a magnetic resonance apparatus wherein, similar to FIG. 1, only the right upper quadrant of the apparatus in longitudinal section is shown. The magnetic resonance apparatus has a substantially hollow-cylindrical, electrically-conductive vacuum vessel 10a of a basic field magnet, with the bore of the vacuum vessel 10a being bulged like a barrel for making use of the concept of the previously cited German OS 101 56 770. A gradient coil system 100a formed of two hollow-cylindrical halves that are separated from one another is arranged in the bore.

This gradient coil system 100a has conductor sections 110 arranged on a first cylinder jacket of a longitudinal gradient coil as well as conductor sections 130 (associated with the gradient coil) of a compensation coil that are arranged on a second cylinder jacket. The second cylinder jacket is spaced a shorter distance from an imaging volume 15a of the magnetic resonance device than the first cylinder jacket. The conductor sections 110 and 130 are connected in series, such that they can be operated with a single controllable voltage source 50. The conductor sections 110 and 130 are designed, for example, such that a mode uninfluenced by eddy currents is enabled given operation of both coils in series. If, in an embodiment, the correction coil is provided with a switch 55 such that it can be short-circuited (and thus bypassed), a mode influenced by eddy currents can be implemented with just the gradient coil. In this mode, the gradient field exhibits a better linearity within the imaging volume 15a.

In general terms the requirements for the compensation of the eddy current field impose limitations in the freedom to selectively design the gradient field generated by the series circuit. In particular the limitations are in the selection of the coefficients of the series expansion of the spherical function representing the gradient field. In particular the linearity of the gradient field over the imaging volume is affected by these limitations. The consequences of the reduced linearity given eddy current-compensating operation, however, can be neutralized, for example by subsequent correction algorithms applied to the acquired magnetic resonance data.

The use of the inventive coil arrangement in a magnetic resonance apparatus employing the concept of German OS 101 56 770 in particular has the advantage that the electrically-conductive structure (for example the vacuum vessel 10a of the basic field magnet) can be fashioned as an eddy current surface with a moderate deformation, for example with a moderate bulge, since only smaller deviations are to be compensated.

The arrangement of conductor sections 130 shown in FIG. 5 to compensate the eddy current field on a surface close to the imaging volume 15a can naturally can be used as a conductor section 110 to generate the gradient field, however, conductor overlapping would be necessary for a good compensation effect in the surface of the gradient field-generating conductor sections. An additional surface for the compensation-effecting conductor sections can be, for example, a surface of the gradient coil system in which cooling devices of the gradient coil system are arranged, and the compensation-effecting conductor sections of all gradient coils of the gradient coil system then can be arranged at or in this surface.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising;

a magnetic resonance scanner having an imaging volume;

a coil arrangement in said scanner adapted to be supplied with a temporaily changing current to generate a magnetic gradient field in said imaging volume;

said scanner including an electrically conductive structure at least partially surrounding said coil arrangement and in which, due to said current in said coil arrangement, eddy currents are caused that produce an eddy current field that interferes with said gradient field in said imaging volume;

said coil arrangement having at least two conductor sections selected from the group consisting of a first conductor section that contributes to the generation of the gradient field, and that generates, via the electrically conductive structure, a first eddy current field in the imaging volume, representing a first interference factor, a second conductor section that contributes to the generation of the gradient field, thereby generating, via the electrically conductive structure, a second eddy current field in the imaging volume, representing a second interference factor, and that additionally generates a field for compensating the first eddy current field, and a third conductor section that contributes exclusively to compensation of said first and second interference factors; and one of the conductor sections that contributes to compensation of said interference factors being spaced, relative to said imaging volume, at less than or equal to a distance of one of the conductor sections contributing to the gradient field.

2. A magnetic resonance apparatus as claimed in claim 1 comprising an actuatable switch connected to said third conductor section for, when closed, short circuiting said third conductor section.

3. A magnetic resonance apparatus as claimed in claim 1 wherein at least two of said conductor sections are connected in series.

4. A magnetic resonance apparatus as claimed in claim 1 comprising a first controllable voltage source connected to one of the conductor sections, and a second controllable voltage source connected to at least one of the conductor sections not connected to the first controllable voltage source, said second controllable voltage source being operable independently of the first controllable voltage source.

5. A magnetic resonance apparatus as claimed in claim 1 comprising a single controllable voltage source connected to at least two of the conductor sections respectively via at least one circuit component selected from the group consisting of an inductive transmitter and a filter device.

6. A magnetic resonance apparatus as claimed in claim 1 wherein said first conductor section is disposed on a first surface in said scanner and said third conductor section is disposed on a second surface in said scanner that is separated from said imaging volume by a shorter distance than said first surface.

7. A magnetic resonance apparatus as claimed in claim 6 wherein said first surface is formed by a first cylinder jacket and wherein said second surface is formed by a second cylinder jacket.

8. A magnetic resonance apparatus as claimed in claim 1 wherein said second conductor section is disposed on a first surface in said scanner and said third conductor section is disposed on a second surface in said scanner that is separated from said imaging volume by a shorter distance than said first surface.

9. A magnetic resonance apparatus as claimed in claim 8 wherein said first surface is formed by a first cylinder jacket and wherein said second surface is formed by a second cylinder jacket.

10. A magnetic resonance apparatus as claimed in claim 1 wherein said electrically conductive structure has a shape for causing, at least within the imaging volume, an eddy current field generated via the electrically conductive structure, to be geometrically similar to the gradient field.

11. A magnetic resonance apparatus as claimed in claim 10 wherein said electrically conductive structure has a barrel-like bulge.

12. A magnetic resonance apparatus as claimed in claim 1 wherein said scanner includes a superconducting basic field magnet having a vacuum vessel, and wherein said vacuum vessel forms said electrically conductive structure.

13. A magnetic resonance apparatus as claimed in claim 12 wherein said vacuum vessel has a barrel-like bulge for causing the eddy current field generated by the vacuum vessel to be geometrically similar to the gradient field, at least within the imaging volume.

* * * * *